United States Patent [19]

Baliga

[11] Patent Number: 4,568,958

[45] Date of Patent: Feb. 4, 1986

[54] INVERSION-MODE INSULATED-GATE GALLIUM ARSENIDE FIELD-EFFECT TRANSISTORS

[75] Inventor: Bantval J. Baliga, Clifton Park, N.Y.

[73] Assignee: General Electric Company, Schenectady, N.Y.

[21] Appl. No.: 567,839

[22] Filed: Jan. 3, 1984

[51] Int. Cl.$^4$ .................... H01L 29/78; H01L 29/161
[52] U.S. Cl. .................... 357/23.4; 357/23.2; 357/16; 357/22
[58] Field of Search .................... 357/23.4, 23.2, 16, 357/22 MD

[56] References Cited

U.S. PATENT DOCUMENTS

| | | | |
|---|---|---|---|
| 4,160,261 | 7/1979 | Casey, Jr. | 357/16 |
| 4,236,166 | 11/1980 | Cho | 357/16 |
| 4,262,296 | 4/1981 | Shealy et al. | 357/55 |

OTHER PUBLICATIONS

T. Ito et al., "The GaAs Inversion-Type MIS Transistors," *Solid-State Electronic*, vol. 17, pp. 751-759 (1974).
C. W. Wilmsen et al., "MOS Processing for III-V Compound Semiconductors: Overview and Bibliography," *Thin Solid Films*, vol. 46, pp. 17-45 (1977).
A. L. Lile et al., "n-Channel Inversion-Mode InP M.I.S.F.E.T.," *Electronics Letter*, vol. 14, No. 20, pp. 657-659, (Sep. 20, 1978).
T. Kawakami et al., "InP/Al$_2$O$_3$ n-Channel Inversion-Mode M.I.S.F.E.T.S Using Sulfur Diffused Source and Drain", *Electronics Letters*, vol. 15, No. 16, pp. 502-504 (8/2/79).
A. S. H. Liao et al., An In$_{0.53}$Ga$_{0.47}$As/Si$_3$N$_4$ n-Channel Inversion Mode MISFET, *IEEE Electron Device Letters*, vol. EDL-2, No. 11, pp. 288-290, (1981).
R. E. Enstrom et al., Vapour Growth of Ga$_x$In$_{x-1}$As as Alloys for Infrared Photocathode Applications, 1970 *Symposium on GaAs*, paper 3, pp. 30-40.

Primary Examiner—Andrew J. James
Assistant Examiner—Terri M. Henn
Attorney, Agent, or Firm—John R. Rafter; James C. Davis, Jr.; Marvin Snyder

[57] ABSTRACT

Inversion-mode insulated field-effect transistor structures are provided wherein a lightly-doped GaAs drift or drain region is combined with a gate-controlled channel structure comprising a film or layer of a semiconductor layer other than GaAs and within which inversion regions may more readily be formed. Suitable semiconductor materials for the gate-controlled channel structure are InP and Ga$_x$In$_{1-x}$As. Presently preferred is a Ga$_x$In$_{1-x}$As graded layer wherein x ranges from 1.0 to about 0.47.

20 Claims, 4 Drawing Figures

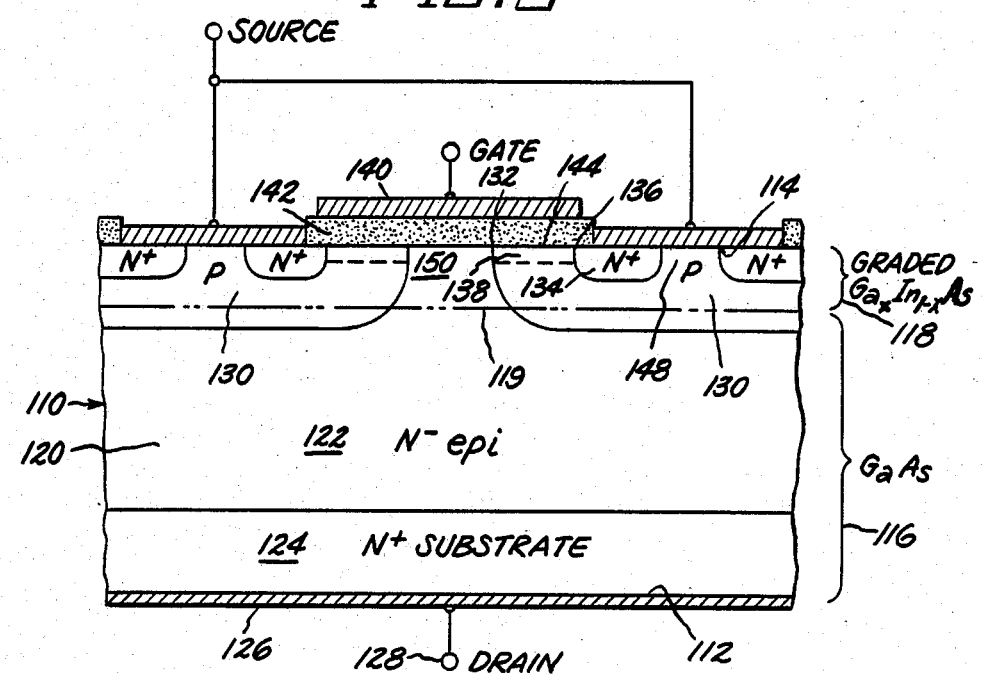
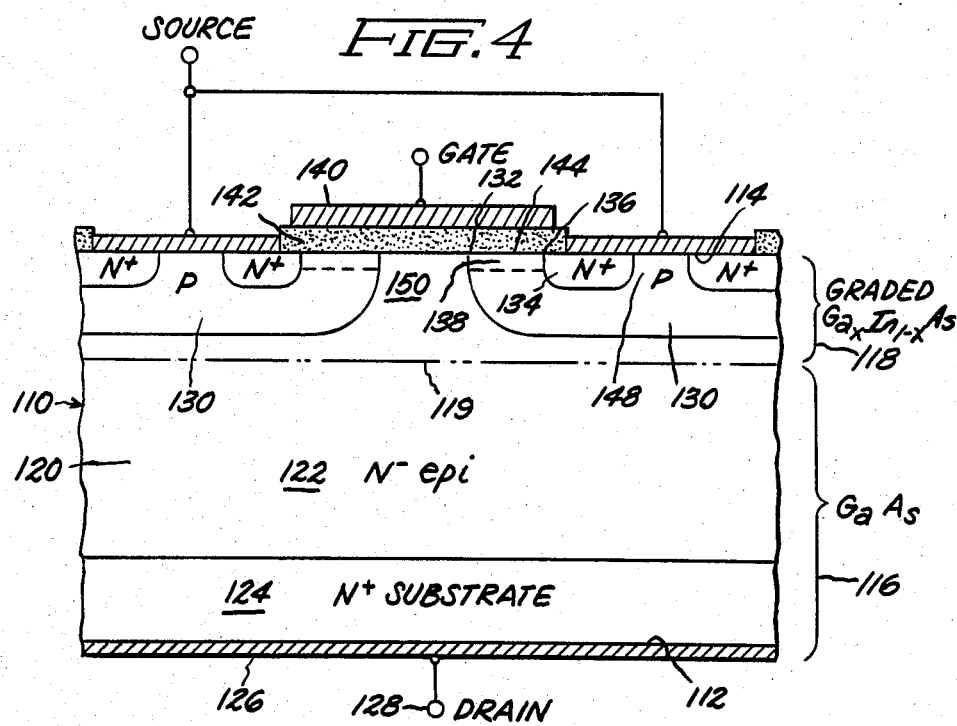

INVERSION-MODE INSULATED-GATE GALLIUM ARSENIDE FIELD-EFFECT TRANSISTORS

BACKGROUND OF THE INVENTION

The present invention relates to inversion-mode (i.e. normally-off) insulated-gate field-effect transistor devices employing gallium arsenide, which is a high-voltage, low-resistance semiconductor material having a number of desirable charateristics. The invention more particularly relates to such devices for power switching applications.

Insulated-gate field-effect transistors (IGFETs) are advantageous in many applications due to their rapid switching speed and the fact they can be fabricated to have a high breakdown voltage (e.g. 500 volts), particularly in various vertical-channel configurations such as vertical-channel DMOS and vertical-channel VMOS. Moreover, a normally-off characteristic may readily be realized. Particular forms of these devices are known as metal-insulator-semiconductor field-effect transistors (MISFETs) and metal-oxide-semiconductor field-effect transistors (MOSFETs). Nearly all power MOSFETs employ silicon (Si) as the device semiconductor material.

Gallium arsenide (GaAs) is an alternative semiconductor material attractive for several reasons. For example, gallium arsenide has an electron mobility five times higher than that of silicon, a higher saturation velocity, and a wider energy gap. In short, gallium arsenide may be characterized as a high-voltage, low resistance semiconductor material.

It may be noted that GaAs is a Group III-V semiconductor inasmuch, in the periodic table of the elements, Ga is in Group III and As is in Group V. It may further be noted that there are other Group III-V semiconductors having characteristics related in some respects.

However, certain characteristics of gallium arsenide, discussed next below, make the fabrication of practical GaAs devices difficult. As a result, despite the above-noted advantageous characteristics of gallium arsenide, its actual use has primarily been limited to Schottky-gate metal-semiconductor field-effect transistors (MESFETs). MESFETs, like junction field-effect transistors (JFETs), are primarily depletion-mode (normally-on) devices. In depletion-mode FETs, a conduction channel exists between source and drain in the absence of gate voltage. To turn the device off requires the application of gate-voltage of the appropriate polarity to induce a depletion region to pinch off the channel. This normally-on characteristic is a disadvantage in many circuit applications.

On the other hand, an inversion-mode (normally-off) FET has a channel layer which is normally not conducting. This channel layer is defined in a semiconductor region of opposite conductivity type compared to the source and drain regions, which region of opposite conductivity type may be termed a shield base or, simply, base region. The channel layer is actually defined only when induced under the influence of gate voltage, which produces an inversion region. In an inversion-mode FET the gate electrode must be insulated from the semiconductor body of the FET.

As noted above, insulated-gate FET technology is well-developed in the case of silicon devices. In such devices, native oxide, i.e. $SiO_2$, serves very well as a gate insulating layer.

On the other hand, while it is possible to form inversion layers in gallium arsenide under insulators, obtaining good interface properties (low surface state densities) between insulators and gallium arsenide has proven to be difficult. Thus, the conduction properties of such inversion layers are poor. These problems are addressed, for example, in T. Ito and Y. Sakai, "The GaAs Inversion-Type MIS Transistors", *Solid-State Electronics*, Vol. 17, pp. 751-759 (1974), which discusses interface properties between GaAs and various insulators such as $SiO_2$, $Si_3N_4$ and $Al_2O_3$ films. All of these interfaces show instabilities, i.e., hysteresis and time drift of capacitance-voltage curves, and further, abnormal frequency dispersion of the capacitances. The solution proposed by Ito and Sakai is to employ, as the gate insulator, a chemically vapor deposited double layer film of $Al_2O_3$ and $SiO_2$. For further background, reference may be had to the following literature reference which identifies several reports of the fabrication of GaAs MOSFETs: C.W. Wilmsen and S. Szpak, "MOS Processing for III-V Compound Semiconductors: Overview and Bibliography", *Thin Solid Films*, Vol. 46, pp. 17-45 (1977).

There are other III-V semiconductors which have interface properties superior to GaAs and in which inversion regions under gate insulators may more readily be formed. For example, see D.L. Lile, D.A. Collins, L.G. Meiners and L. Messick, "n-Channel Inversion-Mode InP M.I.S.F.E.T.", *Electronics Letters*, Vol. 14, No. 20, pp. 657-659 (Sept. 20, 1978). Lile et al. discuss the great potential of microwave transistors based on III-V compounds, and point to several problems in the use of GaAs. Lile et al. propose and report on the performance of InP as an alternative semiconductor material. InP has interface properties superior to those of GaAs, and shares some of the advantageous characteristics of GaAs.

Similarly, another InP inversion-mode device is reported by T. Kawakami and M. Okamura, "InP/$Al_2O_3$ n-channel Inversion-Mode M.I.S.F.E.T.S Using Sulfur-Diffused Source and Drain", *Electronics Letters*, Vol. 15, No. 16, pp. 502-504 (Aug. 2, 1979).

Another III-V semiconductor material is proposed in A.S.H. Liao, R.F. Leheny, R.I. Nahory and J.C. DeWinter, "An $In_{0.53}Ga_{0.47}As/Si_3N_4$ n-Channel Inversion Mode MISFET", *IEEE Electron Device Letters*, Vol. EDL-2, No. 11, pp. 288-290 (1981). Liao et al demonstrate that inversion layers under a gate insulator can be formed in $Ga_xIn_{1-x}As$ where $x=0.47$.

While InP and $Ga_xIn_{1-x}As$ have the property that inversion layers may more readily be formed, they are not as good as GaAs in terms of being high-voltage, low resistance semiconductor materials when all three contributing factors are considered: electron mobility, saturation velocity, and energy gap. In particular, the electron mobility of InP, while greater than that of Si, is only about half that of GaAs. Also, the bandgap of InP is somewhat less than that of GaAs, although it is greater than the bandgap of Si. The on-resistance of a GaAs device is lower than the on-resistance of an InP device by a factor of about 2.5.

The on-resistance of GaAs is lower than that of $Ga_xIn_{1-x}As$, in particular where $x=0.47$, by a factor of about 3.5. This is primarily due to the lower bandgap of $Ga_xIn_{1-x}As$, which is only about two-thirds of that of GaAs, although the election mobility of $Ga_xIn_{1-x}As$ ($x=0.47$) is slightly higher than that of GaAs.

SUMMARY OF THE INVENTION

Accordingly, it is an object of the invention to provide high-voltage power MISFET semiconductor structures employing gallium arsenide, with its relatively high electron mobility, high saturation velocity, and wide energy gap.

Briefly, and in accordance with an overall concept of the invention, inversion-mode insulated-gate field-effect transistor structures are provided wherein the drain region comprises gallium arsenide and wherein the gate-controlled channel structure comprises another semiconductor material in which it is easier to form suitable inversion regions. In a power MISFET, the drain region more particularly comprises a relatively thick (e.g., 10 microns), lightly-doped (e.g. $N^-$) drift region and a separate heavily-doped (e.g. $N^+$) drain terminal region. Significantly, the properties of the $N^-$ drift region largely determine the breakdown and conduction characteristics of the overall device. The $N^-$ drift region supports the relatively high voltages across a MISFET device when it is not conducting and, during forward conduction, the $N^-$ drift region minimizes the voltage drop across the device by maintaining a uniform field to achieve velocity saturation. Saturation velocity varies for semiconductor materials, and is particularly high for GaAs.

Thus, the lightly-doped GaAs drift region is combined with a gate-controlled channel structure comprising an easily inverted semiconductor film formed over the GaAs high voltage drift region. Typically, this film or layer is about 5 microns thick. In particular, the gate-controlled channel structure of the subject devices comprises InP or GaInAs. Presently preferred is a graded GaInAs layer.

More particularly, an inversion-mode insulated-gate field-effect transistor in accordance with the invention comprises source and drain regions of one conductivity type, for example, of N conductivity type, separated by a shield base region of the opposite conductivity type, in this example, P conductivity type. The drain region in turn further comprises a relatively lightly-doped (e.g. $N^-$) drift region defining a PN junction with the shield base region, and a relatively heavily-doped (e.g. $N^+$) drain terminal region contiguous with the drift region and spaced from the shield base region by the drift region.

The shield base region includes a channel layer extending between the source and drain regions. A gate electrode is insulatively spaced from the channel layer and configured for inducing in the channel layer, when gate voltage is applied, an inversion channel conductively coupling the source and drain regions.

At least a portion of the drain region comprises gallium arsenide, and at least a channel-supporting portion of the shield base region comprises a semiconductor material other than gallium arsenide and within which inversion regions may more readily be formed. The channel layer is accordingly included in the channel-supporting portion. As noted above, the shield base region, or at least the channel-supporting portion therof, may comprise InP or GaInAs.

In one particular device structure of the invention, which may be described as a vertical-channel recessed-gate structure, a semiconductor body has a pair of opposed principal surfaces, and the drain, shield base and source regions constitute successive layers of alternate conductivity type within the semiconductor body. The drain region extends to one of the principal surfaces (e.g. lower surface) and the source region extends to the other of the principal surfaces (e.g. upper surface). The drain region in turn further comprises a heavily-doped $N^+$ terminal region immediately adjacent the one principal surface, and a lightly-doped $N^-$ drift region extending between the $N^+$ drain terminal region and the P type shield base layer.

At least one recess is formed in the body extending from the other principal surface through the source and shield base regions. In accordance with usual "VMOS" fabrication techniques, the recess may comprise a "V"-shaped or a "U"-shaped groove. Alternatively, in the case of InP source and shield base regions, an inverted trapezoidal groove may be formed employing appropriate preferential etching techniques.

To provide a gate-controlled structure within the non-GaAs portion of the device, the channel layer is defined in the shield base region adjacent the sidewalls of the recess. The gate electrode is thus located in the recess and insulatively spaced from the recess sidewalls.

Another particular device structure, and one which is presently preferred, is of double-diffused MOS (DMOS) configuration. This device structure also comprises a semiconductor body having a pair of opposed principal surfaces. In this case, the semiconductor body includes first and second layers. However, these first and second layers are of different semiconductor materials, and are not necessarily co-extensive with any of the drain, shield base and source regions of the device.

The first layer comprises gallium arsenide and extends into the body from one of the principal surfaces, e.g., from the lower principal surface. The second layer comprises a graded semiconductor layer extending from an interface with said first layer within the body to the other of the principal surfaces e.g., to the upper principal surface. In particular, the graded second layer comprises gallium arsenide at the interface and comprises gallium indium arsenide (GaInP) at the other principal surface, with the percentage of indium increasing from substantially zero at the interface to a maximum concentration at the other principal surface. More specifically, the graded second layer comprises $Ga_xIn_{1-x}As$, wherein x ranges from about 1.0 at the interface to about 0.47 at the other principal surface.

The N conductivity type drain region comprises at least a portion of the first layer and also comprises a portion of the graded second layer. The lightly-doped drift region of the drain region extends to the other principal surface, and is not co-extensive with either the first GaAs layer or the graded second layer.

The P conductivity type shield base region is formed within the drain region, for example, by conventional diffusion techniques, and extends at least into the graded second layer. In a preferred device form, the P conductivity type shield base region extends completely through the graded second layer and slightly into the GaAs first layer. In either case, the shield base region has a periphery terminating at the other (upper) principal surface.

The $N^+$ source region is conventionally formed within the shield base region and has a periphery terminating at the other (upper) principal surface within and spaced from the periphery of the shield base region so as to define the extent of the channel layer. The channel layer accordingly terminates at the other (upper) principal surface, where the concentration of In is the highest.

Finally, the insulated gate electrode is formed over the channel layer. Thus, the interface between the gate insulator and the semiconductor material is with GaInAs, i.e. $Ga_{0.53}In_{0.47}As$.

BRIEF DESCRIPTION OF THE DRAWINGS

While the novel features of the invention are set forth with particularity in the appended claims, the invention, both as to organization and content, will be better understood and appreciated, along with other objects and features thereof, from the following detailed description, taken in conjunction with the drawings, in which:

FIG. 3 is a cross-sectional view of a DMOS device structure in accordance with the invention employing a first layer of GaAs and a second layer of graded $Ga_xIn_{1-x}As$; and FIG. 4 is a cross-sectional view of a device similar to the FIG. 3 device but wherein the P conductivity type shield base region does not extend all the way through the graded second $Ga_xIn_{1-x}As$ layer.

DETAILED DESCRIPTION

Figure 1:
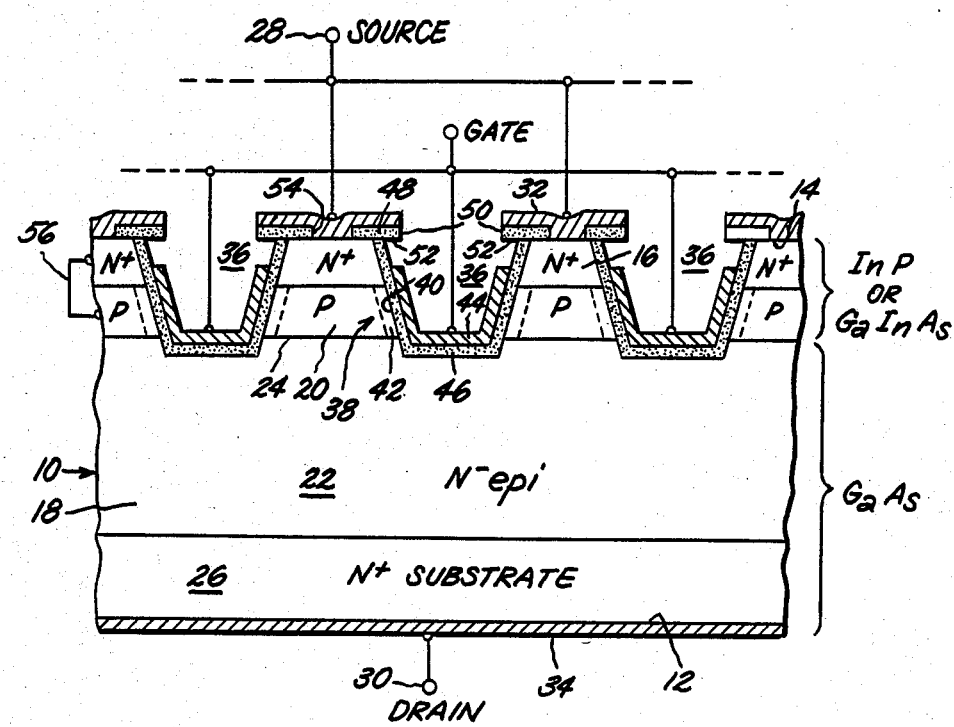
FIG. 1 is a diagrammatic cross-sectional view of the active portion of a vertical-channel VMOS device in accordance with the invention and employing InP in the gate-controlled channel structure.
Figure 2:
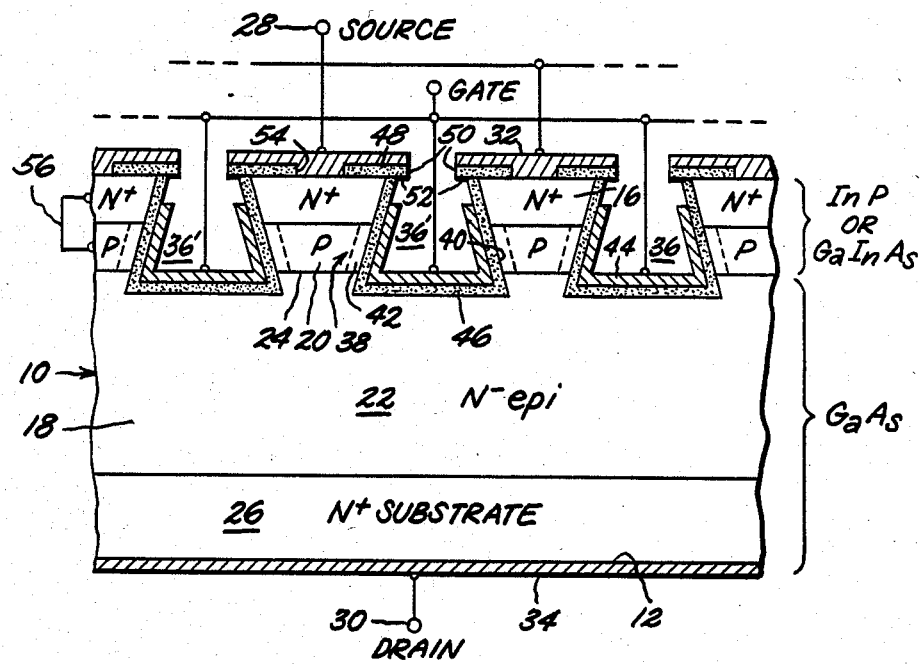
FIG. 2 is a cross-sectional of a similar device wherein, rather than "V"-grooves, grooves of inverted trapezoidal shape are employed.

Described next below with reference to FIGS. 1 and 2 are device structures combining a GaAs drift region and a gate-controlled structure comprising InP. Thereafter, certain shortcomings of the GaAs/InP devices are noted, and device structures combining a GaAs drift region and a gate-controlled structure comprising $Ga_x$-$In_{1-x}As$ are described with reference to FIGS. 3 and 4.

GaAs/InP Embodiments

Referring now to FIG. 1, an N-channel, "V"-groove enhancement-mode gallium arsenide field-effect transistor in accordance with the invention comprises a semiconductor body 10 having a pair of opposed principal surfaces 12 and 14. Formed within the body 10 are source and drain regions 16 and 18 doped with appropriate N-type impurities and separated by a shield base region 20 doped with appropriate P-type impurities. More particuarly, the source region 16 comprises an N+ (heavily-doped to N conductivity type) source region. The drain region 18 in turn comprises an N− (lightly-doped to N conductivity type) drift region 22 defining a PN junction 24 with the shield base region 20, and an N+ (heavily-doped to N conductivity type) drain terminal region 26 contiguous with the drift region 22 and spaced from the P shield base region 20 by the N− drift region 22. Source 28 and drain 30 device main terminals are respectively connected to source and drain metallization layers 32 and 34 which are respectively preferably in ohmic electrical contact with the device N+ source region 16 and the device N+ drain region 26.

It will be appreciated that the FIG. 1 device comprises a plurality of substantially identical unit cells, preferably elongated unit cells defined by suitably-etched recesses in the form of grooves 36 extending into the body 10 from the upper principal surface 14, as is generally conventional practice in VMOS devices. The grooves 36 extend completely through the N+ source 16 and P base 20 regions; and channel-supporting portions 38 of the P base 20 regions intersect sidewalls 40 of the grooves 36. The unit cells have individual source and gate terminal metallization layers connected electrically in parallel among the various unit cells, and share a common drain terminal metallization layer 34.

For selectively inducing an inversion channel region 42 conductively coupling the N+ source 16 and the N− drift 22 regions, a gate electrode 44, typically of metal such as aluminum or gold, is provided and spaced from the semiconductor material comprising the channel region 42 by an insulating layer 46. When the device is off, the channel region 42 is indistinguishable from the bulk of the P base region 20. When positive gate voltage is applied (with reference to the source and for the representative N-channel device), an N conductivity type inversion region is formed in the channel layer 42 from the sidewall 40 surface facing the insulated gate electrode 44.

At least a portion of the drain region 18 comprises gallium arsenide. (In the case of the FIG. 1 device, this portion comprises substantially the entire drain region 18.) In contrast, at least the channel supporting portion 38 of the P conductivity type shield base region 20 comprises a semiconductor material other than gallium arsenide and within which inversion regions may more readily be formed. The channel layer 42 is included in the channel-supporting portion 38. In the case of the FIG. 1 device, the entire shield base region 20 comprises a semiconductor material other than gallium arsenide, but this is not an essential aspect of the invention. What is essential is that at least the portion 38 of the shield base region 20 which supports the conduction channel 42 induced by inversion under the influence of gate voltage is not gallium arsenide.

In FIG. 1, the shield base region 20 comprises either InP or GaInAs. As noted above, it is easier to form inversion regions in both of these materials compared to GaAs.

The nature of the FIG. 1 device may be further understood in view of an exemplary process for fabricating the device.

Device fabrication begins with an N+ GaAs substrate which corresponds to the drain terminal region 26 in the completed device. A typical impurity concentration is $10^{18}$ dopant atoms per $cm^3$. To enable subsequent preferential etching, the substrate has a (100) crystalographic orientation.

Next, an N or N− type GaAs layer is expitaxially grown, this epitaxial layer corresponding to the N− drift region 22 in the completed device of FIG. 1. A typical doping concentration is $10^{17}$ dopant atoms per $cm^3$, although a lower concentration is required to achieve high breakdown voltages. This N− epitaxial layer comprising the drift region 22 contributes significantly to the relatively low on-resistance of the device due to its low electrical resistance. A typical thickness of the epitaxial layer 22 is 10 microns.

Next, a P-type epitaxial layer is grown which, after a subsequent etching step, comprises the P conductivity type shield base regions 20. This P-type layer, however, does not comprise GaAs. Rather, as noted above, the P-type layer comprises a different material within which inversion layers may more readily be formed. A typical example is InP, with a doping concentration ranging from about $10^{15}$ to $10^{18}$ dopant atoms per $cm^3$. A typical doping concentration is $5 \times 10^{15}$ $cm^3$. A typical thickness is about 10 microns. It may be noted that InP has a lattice constant of 5.869 Angstrom, and GaAs has a lattice constant of 5.654 Angstrom. This difference in lattice constant does not prevent epitaxial growth of InP over GaAs. It does, however, result in the generation of some dislocations in the InP layer.

As a final epitaxial growth step, a heavily-doped N+ layer comprising InP is grown over the P-type layer 20 to ultimately form the device source regions 16. Doping concentration for this layer is preferably in excess of $10^{18}$ dopant atoms per $cm^3$.

At this point in the fabrication process, the device simply comprises multi-layered wafer with a PN heterojunction 24 within the device.

The remaining masking, preferential etching, and electrode-forming steps proceed in a relatively conventional manner as follows.

In particular, the wafer is first coated with an insulating layer 48 such as silicon nitride or phosphosilicate glass. Elongated windows 50 are opened in this insulating layer by a suitable masking and etching step. To form the groove 36 configuration of FIG. 1, these windows 50 must be oriented perpendicular to the (110) flat. Next, the InP layers are preferentially etched with a mixture of $H_2SO_4$, $H_2O_2$ and $H_2O$ to create the groove configuration depicted in FIG. 1, which may be described variously as a flat-bottomed "V"-groove, a "U"-groove, or a trapezoidal groove. So that the ultimate gate electrode 44 can induce an inversion channel region along the entire length of the channel layer 42 between the source 16 and drain 18 regions, the grooved recesses 36 must extend entirely through the upper InP N+ and P layers, i.e., entirely through the N+ source 16 and P base 20 regions. It may be noted that the preferential etch step undercuts the upper insulating layer 48 to form overhangs 52.

Next, a suitable gate insulator film 46 is grown or deposited on the interior surface of the groove, in particular, on the sidewalls 40 thereof. As described hereinabove, inversion of InP can be accomplished through gate insulator films of $SiO_2$ and $Al_2O_3$ deposited by chemical vapor deposition. Suitable techniques are described in the literature: for example, see D.L. Lile, D.A. Collins, L.G. Meiners and L. Mesnick, "n-Channel Inversion-Mode InP M.I.S.F.E.T.", *Electronics Letters*, Vol. 14, No. 20 (28 Sept. 1978); and T. Kawakami, and M. Okamura "InP/$Al_2O_3$ n-Channel Inversion-Mode M.I.S.F.E.T.S Using Sulphur-Diffused Source and Drain", *Electronics Letters*, Vol. 15, No. 16, pp. 502-504 (Aug. 2, 1979).

Next, source windows 54 are opened in the upper insulating layer 48, and a metal film, such as aluminum, is evaporated onto the upper surface of the wafer to form, at the same time, both the source metallization 32 and the gate metallization 44. The source 32 and gate 44 metallizations are automatically separated during the evaportion process by the insulating overhang 52.

Finally, metal 34 is evaporated onto the lower surface 12 of the wafer to serve as the drain contact.

In order to reference the potential of the P layer 20 so as to obtain surface inversion of the P layer 20, the N+ source region 16 and P base region 20 must at some point be shorted together by an electrical connection, such as conductor 56, depicted schematically. In practice conductor 56 can be implemented by localized etching of the N+ layer prior to metallization to open windows (not shown) where the source metallization 32 can contact the P base layer 16.

In the operation of the FIG. 1 device, when the device drain terminal 30 is biased positively with respect to the device source terminal 28, the PN heterojunction 24 is reverse-biased and blocks current flow. This is the normally-off, forward blocking condition. For biasing the device into conduction, a positive voltage is applied to the gate terminal, and an inversion channel is formed in the channel layer 42 under the gate electrode 44.

The FIG. 1 device, in general, operates in a manner substantially identical to that of a conventional vertical-channel power MOSFET. That is, with gate electrode 44 sufficiently biased with a positive voltage (with respect to source terminal 28), a conduction channel 42, conductive to electrons, is formed by inversion of P base region 20. Electron current (not shown), which can flow through N-conductivity type semiconductor material, can thus flow between the source and drain terminals 28 and 30, respectively, via the conduction channel 42. In contrast to a conventional vertical-channel power MOSFET, however, the relatively low on-resistance of the GaAs N− drift region 22 is combined with the relative ease of inversion of the InP channel 42 surface and its superior inversion layer conduction properties to result in a device with superior electrical properties.

FIG. 2 depicts a similar device structure differing, however, in that channels 36' in FIG. 2 are of inverted trapezoidal shape. This structure can be achieved by preferential etching with the grooves oriented in a direction perpendicular to that of FIG. 1, i.e., perpendicular to a (110) flat, at least where regions 16 and 20 comprise indium phosphide.

GaAs/Graded $Ga_xIn_{1-x}As$ Devices

The device structures of FIGS. 1 and 2 satisfy the objectives of the invention of achieving high voltage, power MISFET devices by advantageously combining the characteristic of low resistance due to the high electron mobility and band gap of GaAs, with the characteristic of easier inversion of another material. Thus, the difficulty of achieving an inversion layer on a GaAs surface under an insulator is avoided by the invention. Nevertheless, there are drawbacks to the embodiments of FIGS. 1 and 2.

There are two drawbacks in particular. First lattice mismatch between the two semiconductors (GaAs and InP) may create defects in the InP layer. Second, the unequal bandgaps ($E_g$) can cause a small potential barrier at the InP/GaAs interface, and this potential barrier can increase the on-resistance of the device. For InP, the bandgap $E_g$ is 1.35 eV; for GaAs, the bandgap $E_g$ is 1.42 eV.

The device structures of FIGS. 3 and 4 effectively overcome these two drawbacks, while at the same time at least a portion of the N− drift region comprises gallium arsenide, and at least a channel-supporting portion of the shield base region comprises a semiconductor material other than gallium arsenide within which inversion regions may more readily be formed.

In overview, the device embodiments of FIGS. 3 and 4 are of vertical-channel DMOS configuration. As in the previous embodiments, at least a portion of the drain region comprises GaAs. However, rather than InP for the device portions including the gate-controlled conduction channel, a graded composition layer of $Ga_xIn_{1-x}As$ is employed, grown directly over the GaAs layer.

This technique effectively overcomes both of the drawbacks noted above. First, the grading accommodates lattice mismatch. Second, the grading results in a gradual change in the bandgap. Thus, no discontinuity in the conduction band can occur, and no potential barrier is formed. Still another advantage is ease of fabrication employing known techniques.

An advantage, compared to a MISFET formed entirely of GaAs, is that $Ga_xIn_{1-x}As$ has higher electron mobilities than pure GaAs. Thus, the inversion channel resistance is reduced in comparison to that of a MISFET.

Referring in detail to FIG. 3, a gallium arsenide MISFET includes a semiconductor body 110 having a pair of opposed principal surfaces, a lower surface 112 and an upper surface 114. The body 110 includes a first layer 116 comprising GaAs and extending from one of the principal surfaces, for example, from the lower principal surface 112 into the body 110. The body 110 includes a second layer 118 comprising a graded semiconductor layer extending from an interface 119 with the first layer 116 to the other of the principal surfaces, i.e. to the upper principal surface 114. The graded second layer 118 comprises GaAs at the interface 119 and comprises GaInAs at the upper principal surface 114, with the percentage of indium increasing from substantially zero at the interface 119 to a maximum concentration at the principal surface 114. More particularly, the graded second layer 118 comprises a graded composition layer of $Ga_xIn_{1-x}As$, wherein x ranges from about 1.0 at the interface 119 to 0.47 at the upper principal surface 114.

In the FIG. 3 device structure, it is significant that the two semiconductor layers 116 and 118 comprise different semiconductor materials, i.e. GaAs and graded $Ga_xIn_{1-x}As$, respectively. It will be appreciated that these layers are not coextensive with (i.e. do not directly correspond to) the drain, shield base and source regions of the ultimate MISFET. Separate considerations are involved in the device regions of the two conductivity types (i.e. P and N conductivity type and of different conductivities), on the one hand, and in the layers formed of different semiconductor materials, on the other hand.

Considering the actual FIG. 3 device regions, the device includes a drain region 120, which, in turn, comprises a relatively lightly-doped N− drift region 122 and a relatively highly-doped N+ drain terminal region 124 in contact with drain metallization 126 and connected to a representative device drain terminal 128. The drain region 120 comprises at least a portion of the GaAs first layer 116, and also comprises a portion 150 of the graded $Ga_xIn_{1-x}As$ second layer 118. As in a conventional DMOS structure, part of the drain region 120 (or, more particularly, the portion 150 of N− drift region 122 thereof) extends to the device upper principal surface 114.

P conductivity type shield base regions 130 are formed, such as by diffusion, within the drain region 120, more particularly within the N− drift region 122, and extend at least into the $Ga_xIn_{1-x}As$ graded second layer 118. Preferably, for best device performance, the P shield base regions 130 extend completely through the $Ga_xIn_{1-x}As$ graded second layer 118 and slightly into the GaAs first layer 116. In either case, the P field base region 130 has a periphery 132 terminating at the upper principal surface 114.

The final semiconductor region is an N+ source region 134, formed such as by diffusion, within the P conductivity type shield base region 130 and having a periphery 136 terminating at the upper principal surface 114. The periphery 136 of the N+ source region 134 is spaced from the periphery 132 of the P base region 130 to define the extent of a channel layer 138, the channel layer 138 terminating at the upper principal surface 114.

A metal gate electrode 140 is spaced from the channel layer 138 by a gate insulating layer 142 which, it will be appreciated, forms an interface at 144 with the channel layer 138. The channel layer 138 preferably comprises $Ga_{0.47}In_{0.53}As$ at the actual interface 144.

To complete the FIG. 3 device structure, source metallization 146 is provided in preferably ohmic contact with the N+ source region 134. In order to achieve the source-to-base shorts required in power MISFET structures to avoid parasitic bipolar transistor action, a shorting extension 148 of the P base region 130 extends up through the N+ source region 134 to the principal surface 114 in preferably ohmic contact with the source terminal metallization 144.

In the fabrication of the FIG. 3 device, the GaAs first layer 116 is formed by starting with an N+ substrate which ultimately becomes the device drain terminal region 124. The N− drift region 120 is then epitaxially grown. When the top of the GaAs first layer 116 is reached, epitaxial growth continues, but with the gradual introduction of In to result in the growth in the graded composition layer 118 of $Ga_xIn_{1-x}As$.

Thereafter, the actual upper electrode structure of the device is formed employing conventional masking and double diffusion techniques.

With regard to the fabrication of the FIG. 3 device, it may be noted that the successful growth of a graded composition layer of $Ga_xIn_{1-x}As$ on GaAs has been demonstrated, (see, for example, R. E. Enstrom, D. Richman, M. S. Abrahams, J. R. Appert, D. G. Fisher, A. H. Sommers and B. F. Williams, "Vapour Growth of $Ga_xIn_{1-x}A$ As Alloys for Infrared Photocathode Applications", 1970 *Symposium on GaAs*, paper 3, pp. 30–40). Moreover, it has been demonstrated that $Ga_{0.47}In_{0.53}As$ can be inverted using $SiO_2$, $Al_2O_3$ and $Si_3N_4$ as the gate insulator. (See, for example, A. S. H. Liao, R. F. Leheny, K. E. Nahory and J. C. DeWinter, "An $In_{0.53}Ga_{0.47}DAs/Si_3N_4$ n-Channel Inversion Mode MISFET", *IEEE Electron Device Letters*, Vol. EDL-2, pp. 288–290 (Nov. 11, 1981)).

The operation of the FIG. 3 device is substantially identical to the operation of the FIG. 1 device, as discussed above, with the relatively low on-resistance of the GaAs drift region 122 being combined with the relative ease of inversion of the GaInAs channel 138 and its superior inversion layer conduction properties.

Finally, FIG. 4 depicts a slight variation in device structure wherein the P conductivity type shield base region 130 does not extend all the way through the $Ga_xIn_{1-x}As$ graded second layer 118. While the performance of this device is somewhat less than that of the FIG. 3 device, it nevertheless effectively addresses the problems to which the invention is directed. It will be appreciated that in either the FIG. 3 or the FIG. 4 case, the channel-supporting portion of the P base region, comprises $Ga_xIn_{1-x}As$, preferably $Ga_{0.47}In_{0.53}As$.

The foregoing describes high-voltage power MISFET semiconductor structures possessing low on-resistance resulting from the use of gallium arsenide drift regions, while exhibiting good inversion characteristics in a different type of semiconductor material implementing the shield base regions.

While specific embodiments of the invention have been illustrated and described herein, it is realized that numerous modifications and changes will occur to those skilled in the art. For example, the devices of FIGS. 1 and 2, shown with VMOS (grooved) construction, could instead be implemented with DMOS (non-grooved) construction; similarly, the devices of FIGS. 3 and 4, shown with DMOS construction, could be instead implemented with VMOS construction, with the entire channel-supporting region of the shield base region preferably comprising homogeneous $Ga_xIn_{1-x}As$ where $x=0.47$. It is therefore to be understood that the appended claims are intended to cover all such modifications and changes as fall within the true spirit and scope of the invention.

What is claimed is:

1. An inversion-mode insulated-gate field-effect transistor comprising:
    source and drain regions of one conductivity type separated by a shield base region of the opposite conductivity type;
    said shield base region including a channel layer extending between said source and drain regions;
    a gate electrode insulatively spaced from said channel layer and configured for inducing in said channel layer, when gate voltage is applied thereto, an inversion channel region conductively coupling said source and drain regions;
    at least a portion of said drain region comprising gallium arsenide semiconductor material; and
    at least a channel-supporting portion of said shield base region comprising a semiconductor material other than gallium arsenide and within which inversion regions may readily be formed, said channel layer being included in said channel-supporting portion.

2. An inversion-mode insulated-gate field-effect transistor in accordance with claim 1, wherein said shield base region comprises indium phosphide.

3. An inversion-mode insulated-gate field-effect transistor in accordance with claim 1, wherein both said shield base region and said source region comprise indium phosphide.

4. An inversion-mode insulated-gate field-effect transistor in accordance with claim 1, wherein said channel-supporting portion of said shield base region comprises gallim indium arsenide.

5. An inversion-mode insulated-gate field-effect transistor in accordance with claim 1, wherein both said channel-supporting portions of said shield base region and said source region comprise gallium indium arsenide.

6. An inversion-mode insulated-gate field-effect transistor in accordance with claim 4, wherein said shield base region comprises $Ga_xIn_{1-x}As$ with a graded concentration of In and having a maximum concentration of In corresponding to a minimum value of x in said channel-supporting portion.

7. An inversion-mode insulated-gate field-effect transistor in accordance with claim 6, wherein the minimum value of x is about 0.47.

8. An inversion-mode insulated-gate field-effect transistor in accordance with claim 1, wherein said gallium arsenide portion of said drain region comprises a relatively lightly-doped drift region defining a PN junction with said shield base region.

9. An inversion-mode insulated-gate field-effect transistor in accordance with claim 8, wherein said gallium arsenide portion of said drain region further comprises a relatively heavily-doped drain terminal region contiguous with said drift region and spaced from said shield base region by said drift region.

10. An inversion-mode insulated-gate field-effect transistor in accordance with claim 2, wherein said gallium arsenide portion of said drain region comprises a relatively lightly-doped drift region defining a PN junction with said shield base region.

11. An inversion-mode insulated-gate field-effect transistor in accordance with claim 10, wherein said gallium arsenide portion of said drain region further comprises a relatively heavily-doped drain terminal region contiguous with said drift region and spaced from said shield base region by said drift region.

12. An inversion-mode insulated-gate field-effect transistor in accordance with claim 4, wherein said gallium arsenide portion of said drain region comprises a relatively lightly-doped drift region defining a PN junction with said shield base region.

13. An inversion-mode insulated-gate field-effect transistor in accordance with claim 12, wherein said gallium arsenide portion of said drain region further comprises a relatively heavily-doped drain terminal region contiguous with said drift region and spaced from said shield base region by said drift region.

14. An inversion-mode insulated-gate field-effect transistor in accordance with claim 1, having a recessed-gate structure and comprising:
    a semiconductor body containing said source, drain and shield base regions and having a pair of opposed principal surfaces;
    said drain, shield base and source regions constituting successive layers of alternate conductivity type, said drain region extending to one of said principal surfaces and said source region extending to the other of said principal surfaces;
    at least one recess formed in said body extending from said other principal surface through said source and shield base regions;
    said channel layer being contained in said shield base region adjacent the sidewalls of said recess; and
    said gate electrode being located in said recess and insulatively spaced from the sidewalls of said recess.

15. An inversion-mode insulated-gate field-effect transistor in accordance with claim 14, wherein said recess comprises a trapezoidal groove.

16. An inversion-mode insulated-gate field-effect transistor in accordance with claim 14, wherein said recess comprises a flat-bottomed groove.

17. An inversion mode insulated-gate field-effect transistor in accordance with claim 14, wherein said drain region layer comprises gallium arsenide and said shield base and source region layers comprise indium phosphide.

18. An inversion-mode insulated-gate field-effect transistor in accordance with claim 1, having a DMOS configuration and comprising:
    a semiconductor body containing said source, drain and shield base regions and having a pair of opposed principal surfaces;
    said body including a gallium arsenide layer extending from one of said principal surfaces into said body;
    said body including a graded semiconductor layer extending from an interface within said body with said gallium arsenide layer to the other of said principal surfaces, said graded semiconductor layer comprising gallium arsenide at said interface and comprising gallium indium arsenide at said other principal surface, wherein the percentage of indium ranges from substantially zero at said interface to a maximum concentration at said other principal surface;

said drain region of the one conductivity type comprising at least a portion of said gallium arsenide layer and a portion of said graded semiconductor layer, and extending to said other principal surface;

said shield base region of the opposite conductivity type being situated within said drain regions extending at least into said graded semiconductor layer, and having a periphery terminating at said other principal surface; and said source region of the one conductivity type being situated within said shield base region and having a periphery terminating at said other principal surface within and spaced from the periphery of said shield base region to define the extent of said channel layer, said channel layer terminating at said other principal surface.

19. An inversion-mode insulated-gate field-effect transistor in accordance with claim 18, wherein said shield base region extends through said graded semiconductor layer into said gallium aresenide layer.

20. An inversion-mode insulated-gate field-effect transistor in accordance with claim 18, wherein said graded semiconductor layer comprises $Ga_xIn_{1-x}As$, wherein x ranges from about 1.0 at said interface to about 0.47 at said other principal surface.

* * * * *